United States Patent [19]

Ellion

[11] Patent Number: 4,710,588
[45] Date of Patent: Dec. 1, 1987

[54] COMBINED PHOTOVOLTAIC-THERMOELECTRIC SOLAR CELL AND SOLAR CELL ARRAY

[75] Inventor: M. Edmund Ellion, Arcadia, Calif.

[73] Assignee: Hughes Aircraft Company, Los Angeles, Calif.

[21] Appl. No.: 915,354

[22] Filed: Oct. 6, 1986

[51] Int. Cl.$^4$ .................. H02N 6/00; H01L 25/02; H01L 35/00
[52] U.S. Cl. .................. 136/206; 136/246; 136/248; 136/262
[58] Field of Search ............. 136/246, 248, 262, 206

[56] References Cited

U.S. PATENT DOCUMENTS

| | | | |
|---|---|---|---|
| 3,956,017 | 5/1976 | Shigemasa | 136/206 |
| 4,002,031 | 1/1977 | Bell | 60/641.15 |
| 4,106,952 | 8/1978 | Kravitz | 136/206 |
| 4,320,246 | 3/1982 | Russell | 136/248 |
| 4,500,741 | 2/1985 | Morimoto et al. | 136/206 |

Primary Examiner—Aaron Weisstuch
Attorney, Agent, or Firm—Steven M. Mitchell; Mark J. Meltzer; A. W. Karambelas

[57] ABSTRACT

A solar cell generates an electrical voltage with contributions from both photovoltaic and thermoelectric effects, when a high thermal gradient is impressed across a semiconductor p/n solar cell. To achieve a substantial thermoelectric voltage contribution, the front side of the solar cell is heated to an elevated temperature consistent with efficient operation of the photovoltaic mechanism of the solar cell, and the back side of the solar cell is cooled to a lower temperature. The magnitude of the thermoelectric voltage contribution is increased by reducing the coefficient of thermal conductivity of the solar cell material, by using face electrodes having the proper thermoelectric potentials in contact with the solar cell material, by increasing the light intensity and then the heat input to the front side of the solar cell, and by cooling the back side of the solar cell. The preferred material of construction is gallium arsenide, and the solar cell can be mounted to receive concentrated sunlight on its front side and to be cooled on its back side by enhanced thermal radiation.

13 Claims, 4 Drawing Figures

COMBINED PHOTOVOLTAIC-THERMOELECTRIC SOLAR CELL AND SOLAR CELL ARRAY

BACKGROUND OF THE INVENTION

This invention relates generally to solar cells, and, more particularly, to a solar cell array having an improved ratio of power output to weight.

Semiconductor solar cells are utilized to convert light energy to useable electrical voltages and currents through the photovoltaic effect. Briefly, a typical semiconductor solar cell includes an interface between n-type and p-type transparent semiconductor materials. Light shining on the semiconductor materials adjacent the interface creates hole-electron pairs in addition to those otherwise present, and the minority charge carriers migrate across the interface in opposite directions. There is no compensating flow of majority carriers, so that a net electrical charge results. A useful electrical current is then obtained in an external electrical circuit by forming ohmic contacts to the materials on either side of the interface.

In general terms, a photovoltaic solar cell is fabricated by depositing the appropriate semiconductor layers onto a substrate, and then adding additional components to complete the cell. The most common type of solar cell is the n-on-p silicon solar cell, wherein a layer of n-doped silicon overlies a layer of p-doped silicon, so that the n-doped siliocon faces the sun. Gallium arsenide solar cells are of increasing interest, since such cells can produce 25 percent to 40 percent more power per unit area than a silicon solar cell. Gallium arsenide is, however, over twice as dense as silicon, so that the power output per unit weight of solar cell is less for a conventional gallium arsenide cell than a silicon cell.

The individual solar cells are connected together into large arrays to deliver power of the desired voltage and current. The ratio of power output to weight of the solar cell array is an important spacecraft design parameter, since the required power output could in principle be satisfied by larger numbers of low density, low output solar cells made of silicon, or by smaller numbers of high density, high output solar cells made of gallium arsenide. Large numbers of solar cells require more supporting structure, which adds weight and complexity to the spacecraft. Gallium arsenide solar cells continue to receive much attention, as methods are explored to overcome their weight disadvantage arising from the weight of the solar cell itself, so that advantage can be taken of the reduced weight of supporting structure required of such cells.

As an example of the fabrication of a solar cell, a p-on-n gallium arsenide solar cell is fabricated by epitaxially depositing a layer of n-type gallium arsenide onto a single crystal gallium arsenide substrate, and depositing a layer of p-type gallium arsenide overlying the layer of n-type gallium arsenide, so that the layer of p-type gallium arsenide faces the sun during operation. The interface between the p-type gallium arsenide and the n-type gallium arsenide forms the basic solar cell active region. External ohmic electrical contacts to the n-type and p-type layers are applied, and a voltage is measured across the contacts when light energy is directed against the interface. Optionally, a P+ layer of aluminum gallium arsenide may be deposited over the layer of p-type gallium arsenide to limit recombination of charge carriers. To protect the solar cell from physical contact and radiation damage such as encountered in a space environment, it is conventional to apply a transparent cover of glass over the solar cell components.

A number of the individual solar cells are connected together in an array, typically by fastening the solar cells to a support structure and then electrically interconnecting the cells into series and parallel arrangements, as necessary to meet the spacecraft power requirements. Presently operating earth satellites such as a Hughes Aircraft Co. HS-376 communications satellite may have as many as 20,000 silicon solar cells, each about 2 centimeters by 4 centimeters in size. The solar cells are typically arrayed either on a cylindrical structure which both supports the solar cells and also forms the exterior wall of the spacecraft, or on a wing-like structure extending outwardly from the body of the spacecraft. Since the cost of raising weight to orbit is high, the weight of the solar cells, their associated hardware, and the solar cell arrays is desirably reduced as much as possible. This incentive for improved power output and weight reduction is particularly pressing for solar cells such as gallium arsenide solar cells, which have higher power output per unit area than silicon solar cells, but continue to be at a disadvantage in power output per unit weight, because of their higher densities.

Thus, there is a continuing need for an approach for increasing the ratio of power output to weight for solar cells and solar cell arrays, particularly for those types of solar cells that are made of dense materials. An answer to this need should be compatible with existing technology and manufacturing operations for the solar cells and arrays, and should not be incompatible with further advances in these fields. The present invention fulfills this need, and further provides related advantages.

SUMMARY OF THE INVENTION

The present invention resides in a solar cell and solar cell array having an improved ratio of power output to weight, as compared with conventional solar cells and solar cell arrays of related types. The invention is fully compatible with existing structures and methods of fabrication, and with optimum operation of the solar cells. It is also compatible with a variety of arrangements of the array. In the preferred application to gallium arsenide solar cell arrays, the overall ratio of power output to weight of the array is improved by as much as about 50 percent, as compared with a conventional gallium arsenide solar cell array.

In accordance with the preferred embodiment of the invention, a solar cell array comprises a plurality of electrically connected gallium arsenide solar cells; means for imposing a thermal gradient across the thickness of each of the solar cells greater than that normally experienced by gallium arsenide solar cells exposed to direct sunlight, a hot face of the solar cells being at a temperature greater than a cool face thereof; and face electrode means in contact with the solar cells, including a hot junction electrode producing a high thermoelectric potential at the hot face and a cool junction electrode producing a low thermoelectric potential at the cool face of each of said solar cells.

An enhanced power output of the solar cells is attained through the generation of power by the thermoelectric effect. To take advantage of this effect, the hot face of the solar cell should be hotter than the cool face.

The temperature decrease through the thickness of the solar cell between the hot face and the cool face should be as great as possible, consistent with the limitation that the solar cell must be maintained within its normal operating limits of temperature.

Although there is a slight temperature gradient in conventional solar cells and solar cell arrays, this gradient is typically so low that any thermoelectric contribution to the power output is negligibly small. To attain a significant contribution to the power output, the thermal gradient must be higher than normally experienced by a solar cell exposed to direct sunlight. An increased temperature gradient or drop can be induced by heating the hot face of the cell, cooling the cool face of the cell, or both. It is not practical to supply auxiliary heating and cooling equipment when the solar cell and array are used in space, because of the excessive weight and power requirements. It is therefore necessary that the heating and cooling be supplied in a manner consistent with the effective use of the solar cell array.

Besides the selection of the heating and cool means to achieve a high thermal gradient through the solar cell, the selection of the materials of construction also plays an important part. The lower the thermal conductivity of a material, the higher the thermal gradient that can be readily induced through the thickness of the material. The semiconductor material of the solar cell should therefore be of a low thermal conductivity consistent with material selection as a photovoltaic material. The total power output of the solar cell is the combination of the photovoltaic contribution and the thermoelectric contribution, and joint optimization of the two contributions is necessary. The material cannot be selected and optimized for thermoelectric contribution only. Fortunately, gallium arsenide has the desired low thermal conductivity, about 1/10 that of silicon, as well as a high power output by the photovoltaic effect. Thus, gallium arsenide is an excellant choice for the solar cell material to be used in conjunction with the invention. The gallium arsenide solar cell can be operated within its normal operating parameters, and arranged to produce power both by the photovoltaic effect and the thermoelectric effect.

In conventional solar cells, the external electrical circuit is completed through face electrodes on the solar cell. These electrodes are normally electrical conductors deposited as thin, digitated layers in contact with the semiconductor layers of the solar cell. The charge carriers in the semiconductor layers flow through the face electrodes and to the external circuit. In the present solar cell, the face electrodes contribute to the power output of the cell by forming a hot junction and a cool junction, in combination with the layers of the semiconductor material. Specifically, the hot junction is formed by the contact between the face electrode and the semiconductor layer at the hot face which is nearer the sun, and the cool junction is formed by the contact between the face electrode and the semiconductor at the cool face.

The face electrodes should therefore be chosen to maximize the thermoelectric power of the solar cell. The face electrode at the hot junction should have a high potential in combination with the semiconductor, and the face electrode at the cool junction should have a low potential in combination with the semiconductor. In each case, however, the face electrode must have sufficiently high electrical conductivity to fulfill its function of conducting charge to the external circuit. In the presently preferred embodiment of a gallium arsenide solar cell, the preferred face electrode for both the hot and cool junctions is a telluride such as lead telluride.

As indicated previously, the thermal gradient through the thickness of the solar cell can be increased by heating the front of the solar cell, or cooling the back. In accordance with the invention, a solar cell array comprises a plurality of electrically connected solar cells mounted on a support, the thermal conductivity of the cells being less than about 50 Btu/ft$^2$-hr-°F./ft; and means for increasing the temperature gradient through the cell to a value greater than that experienced in direct sunlight. The means for increasing preferably includes a concentrator such as a mirror or lens for focussing an increased amount of sunlight onto the front side of the solar cell, thereby heating the hot face to a controllable temperature greater than that normally experienced in direct sunlight and increasing the gradient by increasing the temperature of the hot face. The means for increasing can also include a radiator or heat pipe on the back side of the solar cell to remove heat therefrom, also increasing the gradient by lowering the temperature of the cool face. The radiator can be a support surface upon which the solar cells are mounted, the support surface having a radiating area at least about 50 times greater than that of the solar cells mounted thereupon, so that the support surface can effectively radiate heat conducted to it through the solar cells. Alternatively, the backside of the solar cell array can be cooled by conduction, as with a water cooling system, when used in a ground-based system for generating electrical power. In such an embodiment, weight is less critical, and a more efficient cooling system can be used.

More specifically, and in a most preferred embodiment, a solar cell array comprises a plurality of electrically connected solar cells, the thermal conductivity of the solar cells being less than about 50 Btu/ft$^2$-hr-°F./ft; a concentrator for concentrating the incident sunlight upon the cells, increasing the thermal loading upon a hot face of the cells above that of normal sunlight; means for cooling a cool face of the solar cells; and face electrode means in contact with the solar cells, including a hot junction electrode producing a high thermoelectric potential at the hot face and a cool junction electrode producing a low thermoelectric potential at the cool face of each of said solar cells, whereby a thermal gradient is imposed from the hot face to the cool face of the solar cells greater than that experienced in the absence of the concentrator and the means for cooling.

It will now be apparent that the solar cell and solar cell array of the invention provide a significant advancement in the art of solar cell systems for providing electrical power on spacecraft. The solar cells achieve an enhanced ratio of power output to weight by producing increased power. The higher power output is achieved from a photovoltaic contribution and a thermoelectric contribution. The power output of a gallium arsenide solar cell array can be increased by as much as about 50 percent with concentrators on the front and radiators on the back of the solar cell array. Other features and advantages of the present invention will be apparent from the following more detailed description, taken in conjunction with the accompanying drawings, which description illustrates, by way of example, the features of the invention.

DETAILED DESCRIPTION OF THE PREFERRED EMBODIMENT

Figure 1:
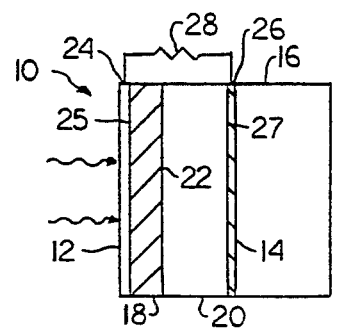
FIG. 1 is a side sectional view of a solar cell.
Figure 2:
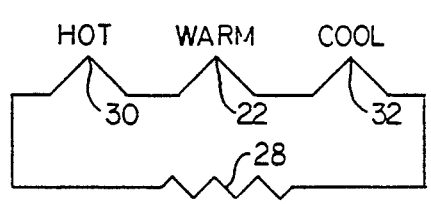
FIG. 2 is a schematic circuit diagram of the solar cell of FIG. 1, illustrating the origin of the contributions to power output.

The origins of the photovoltaic and thermoelectric contributions to the solar cell power output are illustrated in FIGS. 1 and 2. FIG. 1 depicts the elements of a solar cell 10, here shown as a p-on-n gallium arsenide solar cell. A front side 12 of the solar cell 10 faces the sun, while a back side 14 rests upon a support 16. The solar cell 10 includes a p-doped layer 18 overlying an n-doped layer 20, so that an interface 22 is formed between the two layers 18 and 20. Light photons of the proper energy are absorbed by the layers 18 and 20, creating hole-electron pairs. Due to the internal potential energy state of the solar cell 10 in the neighborhood of the interface 22, electrons accumulate in the n-doped regions, and holes accumulate in the p-doped regions, creating a permanent electric field within the solar cell 10. The voltage created in this manner is a photovoltaic potential, and does not depend upon the presence of a thermal gradient within the solar cell 10. It is this photoelectric voltage that is the source of the potential and current in conventional semiconductor solar cells.

In accordance with the invention, a further contribution to the useable voltage is supplied by the thermoelectric effect, also sometimes called the Seebeck effect. A thermoelectric voltage is developed in a thermal gradient, created by a temperature difference, because of the thermal diffusion of electrons and holes. In a material having an internal thermal gradient and free electrons, the charge carriers have greater thermal motion in regions having higher temperature. Thermal diffusion of electrons builds up an excess of electrons in the cool regions, thereby creating an electric field and associated thermoelectric voltage. Charge carriers tend to diffuse internally so as to decrease the electric field, but internal resistance and the potential energy near the interface 22 reduce the ability of the charge carriers to flow internally. Thus, a material such as a semiconductor having a degree of internal resistance can develop an appreciable thermoelectric potential.

The photovoltaic and thermoelectric effects work together in creating an additive electric field in the solar cell 10 of the present invention. Both phenomena result in electrons being accumulated in the n-doped layer 20 of the solar cell 10, and holes being accumulated in the p-doped layer 18. An external electric current can be produced from the permanent electrical field by attaching a p-layer face electrode 24 to a hot face 25 of the p-doped layer 18, and an n-layer face electrode 26 to a cool face 27 of the n-doped layer 20, and then electrically connecting the electrodes 24 and 26 through an external resistance 28. Although the hot face 25 and the cool face 27 are illustrated in FIG. 1 to be adjacent the front side 12 and the back side 14, respectively, the faces 25 and 27 can be buried inside the solar cell 10.

As schematically illustrated in FIG. 2, the interface between the p-layer face electrode 24 and the p-doped layer 18, at the hot face 25, is a hot junction 30. The interface between the n-layer face electrode 26 and the n-doped layer 20, at the cool face 27, is a cool junction 32. The interface 22 between the p-doped layer 18 and the n-doped layer 20 is a warm junction whereat the photovoltaic potential arises.

Although all solar cells have a minor thermal gradient through their thickness, the magnitude of the thermoelectric effect has been small due to the low temperature difference of about 0.01° F. across the normal unconcentrated silicon solar cell. A typical solar cell is on the order of about 0.010 inches in thickness, and a low temperature difference results in a temperature gradient and thermoelectric effect that are negligible.

In order to have a significant thermoelectric effect, the magnitude of the thermal gradient through the thickness of the solar cell 10 must be increased above that produced by normal incident sunlight. This increased gradient can be achieved by increasing the temperature at the hot face 12, decreasing the temperature at the cool face 14, selecting a solar cell material having a low thermal conductivity, selecting materials having high thermoelectric potentials in combination at the junctions, or any combination of these actions.

The temperature of the hot face 12 is most conveniently increased by concentrating the available energy, sunlight, upon the front side 12. Concentration of the sunlight increases the temperature of the hot face 25 and the hot junction 30. The concentration of sunlight can be accomplished by any convenient means, such as mirrors 34 illustrated in FIG. 3, or lenses 36 illustrated in FIG. 4. The temperature of the hot junction 30 may be increased to arbitrarily high temperatures using mirrors or lenses, but the desired maximum temperature is determined by the decreasing efficiency of the photovoltaic output of the solar cell 10 with increasing temperature. The desired maximum temperature is dependent upon the material of the solar cell 10, but for a gallium arsenide cell the preferred maximum temperature has been determined to be about 200° F.

Figure 3:
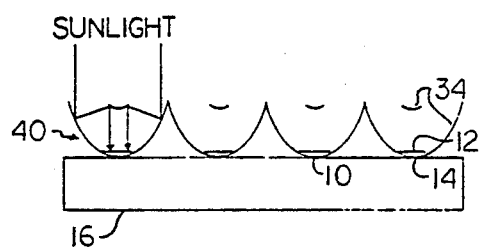
FIG. 3 is a side elevational view of a preferred arrangement for a solar cell array.
Figure 4:
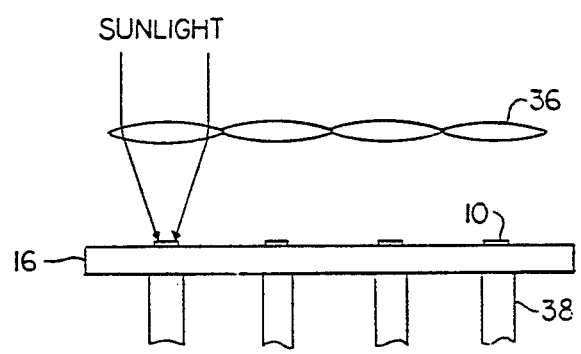
FIG. 4 is a side elevational view of another arrangement for a solar cell array.

The thermal gradient can be increased by cooling the back side 14 by radiating heat to space, thence cooling the cool face 27 and the cool junction 32. Typically, for a concentrator cell the cool junction 32 operates at a temperature of about 150° F., with such cooling in operation. The back side 14 can be cooled by any suitable means, as by forming the support 16 of an efficiently radiating material such as one having a high thermal emissivity and a high thermal conductivity. The radiating area of the support 16 is also made much larger than the effective area of the solver cells 10 that produce power because of the concentrators, so that the heat from the solar cell 10 can be efficiently radiated to the vacuum environment of space as illustrated in FIG. 3. In another approach, heat can be removed from the cool face 14 with heat pipes 38, illustrated in FIG. 4. In yet another approach useful in ground-based solar cell arrays, the back side can be cooled by conduction, as with a cooling fluid such as water. This alternative is heavier but provides a higher rate of heat extraction from the bakc side 14 to boost the temperature gradient and thence the efficiency of the solar cell 10.

It is essential that the material of the solar cell 10 be selected to have a relatively low coefficient of thermal conductivity. Even if the front side 12 of the solar cell 10 is heated to a relatively high temperature, if the coefficient of thermal conductivity is high there will not be a high thermal gradient developed within the solar cell 10. Instead, there will be a high heat flux without the necessary gradient.

It has been determined that the coefficient of thermal conductivity of the solar cell material should be less than about 50 Btu/ft$^2$-hr-°F./ft for a solar cell of conventional thickness. If materials of higher conductivity are used, the slight increase in efficiency over a conventional solar cell is not sufficient to justify the change. Fortunately, gallium arsenide has a coefficient of thermal conductivity of about 30 Btu/ft$^2$-hr-°F./ft, and meets this requirement. The low coefficient of thermal conductivity permits a high thermal gradient within the solar cell, if a sufficiently high temperature is applied to the front side 12.

The thermoelectric effect and its contribution to the total output of the solar cell 10 can be further improved by selecting materials having desirable thermoelectric potentials. The material for the hot junction face electrode 24 should have an inherently high thermoelectric potential in combination with the layer 18 to which it is bonded. The cool junction face electrode 26 should have an inherently low thermoelectric potential in combination with the layer 20 to which it is bonded, inasmuch as its potential is opposite to that of the hot junction and the photovoltaic effect, but is much smaller in magnitude. The selection of the materials used in the face electrodes depends upon the materials of the solar cell. For a gallium arsenide solar cell, the preferred material for both the p-layer face electrode 24 and the n-layer face electrode 26 is lead telluride.

For a conventional gallium arsenide solar cell operating at 200° F., the cell efficiency is about 15.5 percent. Concentrating the light of the sun on the hot face of the cell with a concentration ratio of 50 (that is, collecting sunlight from an area 50 times larger than the area of the solar cell, and concentrating that light onto the face of the solar cell), the efficiency rises to about 18.6 percent. By operating with the preferred solar cell array 40 illustrated in FIG. 3 having a ratio of radiating area to active solar cell area of about 50, and so that the temperature of the hot face is about 200° F. and the temperature of the cool face is about 150° F., the efficiency is raised to about 22 percent, a 40 percent increase over an unconcentrated cell and an 18 percent increase over a concentrated cell not having the through-thickness cooling that promotes a thermoelectric potential.

Thus, the present invention permits the improvement in solar cell output power by judicious selection of materials of construction and array design, to obtain a significant contribution from the thermoelectric effect as well as the photovoltaic effect. Although a particular embodiment of the invention has been described in detail for purposes of illustration, various modifications may be made without departing from the spirit and scope of the invention. Accordingly, the invention is not to be limited except as by the appended claims.

What is claimed is:

1. A solar cell array, comprising:
    a plurality of electrically connected gallium arsenide solar cells;
    means for imposing a thermal gradient across the thickness of each of said solar cells greater than that normally experienced by gallium arsenide solar cells exposed to direct sunlight, a hot face of said solar cells being at a temperature greater than a cool face thereof; and
    face electrode means in contact with said solar cells, including a hot junction electrode producing a high thermoelectric potential at said hot face and a cool junction electrode producing a low thermoelectric potential at said cool face of each of said solar cells.

2. The solar cell array of claim 1, wherein said said face electrodes are lead telluride.

3. The solar cell array of claim 1, wherein said means for imposing includes means for increasing the temperature of said hot face of said solar cells.

4. The solar cell array of claim 1, wherein said means for imposing includes a mirror for concentrating sunlight onto said hot face of said solar cells.

5. The solar cell array of claim 1, wherein said means for imposing includes a lens for concentrating sunlight onto said hot face of said solar cells.

6. The solar cell array of claim 1, wherein said means for imposing includes means for removing heat from said cool face of said solar cells.

7. The solar cell array of claim 1, wherein said means for imposing includes a radiating support upon which said cells are mounted, said radiating support having a radiating area at least about 50 times greater than the active area of said solar cells.

8. The solar cell array of claim 1, wherein said means for imposing includes a heat pipe for removing heat from the cool face of said solar cells.

9. A solar cell array, comprising:
    a plurality of electrically connected solar cells, the thermal conductivity of said solar cells being less than about 50 Btu/ft$^2$-hr-°F./ft;
    a concentrator for concentrating the incident sunlight upon said cells, increasing the thermal loading upon a hot face of said cells above that of normal sunlight;
    means for cooling a cool face of said solar cells; and
    face electrode means in contact with said solar cells, including a hot junction electrode producing a high thermoelectric potential at said hot face and a cool junction electrode producing a low thermoelectric potential at said cool face of each of said solar cells, whereby a thermal gradient is imposed from the hot face to the cool face of said solar cells greater than that experienced in the absence of said concentrator and said means for cooling.

10. The solar cell array of claim 9, wherein said solar cells are gallium arsenide solar cells.

11. The solar cell array of claim 9, wherein said means for cooling is a support upon which said cells are mounted, the radiating area of said support being at least 50 times that of the power-producing area of said solar cells.

12. The solar cell array of claim 9, wherein said means for cooling is a heat pipe.

13. The solar cell array of claim 9, wherein said solar cells are gallium arsenide.

* * * * *